United States Patent [19]
Sengupta et al.

[11] Patent Number: 5,915,203
[45] Date of Patent: Jun. 22, 1999

[54] METHOD FOR PRODUCING DEEP SUBMICRON INTERCONNECT VIAS

[75] Inventors: Samit Sengupta; Subhas Bothra, both of San Jose, Calif.

[73] Assignee: VLSI Technology, Inc., San Jose, Calif.

[21] Appl. No.: 08/872,562

[22] Filed: Jun. 10, 1997

[51] Int. Cl.$^6$ .................................................. H01L 21/44
[52] U.S. Cl. ........................ 438/669; 438/687; 438/640; 438/631; 438/633
[58] Field of Search .................................... 438/627, 633, 438/669, 622, 625, 637, 661, 667, 624, 631, 640, 687

[56] References Cited

U.S. PATENT DOCUMENTS

| | | | |
|---|---|---|---|
| 5,497,027 | 3/1996 | Crafts ...................................... | 257/528 |
| 5,654,216 | 8/1997 | Adrian .................................... | 438/627 |
| 5,756,396 | 5/1998 | Lee et al. ................................ | 438/622 |
| 5,801,093 | 9/1998 | Lin ......................................... | 438/624 |

OTHER PUBLICATIONS

Michael T. Welch et al., Pillar Interconnections for VLSI Technology, Jun. 9–10, 1986 V–Mic Conf., pp. 450–456.

S.M. Rossnagel et al., Metal Ion Deposition From Ionized Mangetron Sputtering Discharge, J. Vac. Sci. Technol. B 12(1), Jan./Feb. 1994.

Bruce Roberts et al., Interconnect Metallization for Future Device Generations, Solid State Technology, Feb. 1995.

G.A. Dixit et al., A Robust, Versatile MOCVD TiN Process, Jun. 27–29, 1995 VMIC Conference, 1995 ISMIC—104/95/0175.

Shi–Qing Wang et al., Step Coverage Comparison of Ti/TiN Deposited by Collimated and Uncollimated Physical Vapor Deposition Techniques, J. Vac. Sci. Technol. B 14(3), May/Jun. 1996.

Subhas Bothra et al., W–Plug Via Integration Issues, Solid State Technology, Feb. 1997.

*Primary Examiner*—Charles Bowers
*Assistant Examiner*—Reneé R. Berry
*Attorney, Agent, or Firm*—Flehr Hohbach Test Albritton & Herbert, LLP

[57] ABSTRACT

A method of producing deep submicron vias is described in which a metal blanket layer is formed on a premetal dielectric and patterned to form line elements. An intermetal dielectric is then deposited over the patterned metal and chemically mechanically polished down to the top of the line elements. A second metal blanket layer is then deposited and patterned to form via studs. An intermetal dielectric is also deposited over the patterned metal via studs and polished down to the tops of the studs. The process is repeated until a multilevel integrated circuit is formed.

11 Claims, 1 Drawing Sheet

METHOD FOR PRODUCING DEEP SUBMICRON INTERCONNECT VIAS

FIELD OF THE INVENTION

This invention relates generally to the field of fabricating integrated circuits and more particularly to the elimination of step coverage problems in the formation of deep vias in the submicron range.

BACKGROUND OF THE INVENTION

As the demand for greater speed and higher density integrated circuits has increased, there has of course been continued progress towards smaller feature sizes. These smaller features demand improved process technologies so as to maintain the integrity of the circuits in considerably smaller spaces. As an example, a typical back end process flow requires patterning of metal lines and vias down to 0.35 μm and below. The requirement of these smaller features has prompted the growth of a number of key technologies such, for instance, as high density plasma chemical vapor deposition (HDPCVD) for superior gap performance; chemical mechanical polishing (CMP) so as to minimize topography; and new etch chemistries for enhanced selectivities. More particularly, the shrinking of interconnect features in integrated circuits has itself created numerous challenges, including increased resistances of the vias themselves; incidents of vias falling off metal due to poor alignment control; and, significant from a process standpoint, step coverage issues in filling higher aspect ratio vias.

Various techniques to improve such step coverage of barrier metal on vias has been recommended, some are currently in practice; for instance, collimated sputtering, ionized metal plasma (IMP) sputtering and chemical vapor deposition (CVD), as set forth in various articles such as "Metal Ion Deposition From Ionized Magnatron Sputtering Discharge", by S. M. Rossnagel et al., published in J. Vac. Sci. Technol., January/February, 1994 at page 449; "A Robust, Versatile MOCVD TiN Process", by G. A. Dixit et al., 1995, VMIC Conference at page 175; and "Step Coverage Comparison of Ti/TiN Deposited By Collimated and Uncollimated Physical Vapor Deposition Techniques", by Shi-Qing Wang et al., J. Vac. Sci. Technol., May/June, 1996. In addition, aluminum reflow at high temperatures and a dual-damascene process using Cu CVD have been suggested as possible alternatives useful in sub 0.25 μm interconnect technologies and beyond. Even so, device reliability and or manufacturability remain issues of prime concern.

In a conventional 0.35 μm back in flow, metal line structures are patterned from blanket film stacks, followed by deposition of the intermetal dielectric (IMD). After IMD planerization by chemical mechanical polishing (CMP), vias are etched through the dielectric, typically an oxide, through to the metal below. Vias are then filled by depositing a glue or a glue layer consisting of Ti/TiN prior to the CVD tungsten. Subsequent etchback or chemical metal polishing processes complete the via field sequence.

BRIEF SUMMARY OF THE INVENTION

The evolution of chemical mechanical polishing has greatly simplified related process details and steps while providing improved critical dimension control. In the following description, a new method for via integration is presented and which utilizes many of the useful features of the oxide gap fill, CMP and plasma etch selectivity. The particular advantage of the process described herein is the elimination of step coverage issues associated with a standard via fill process.

Generally, the process employs the steps of forming a metal blanket layer over a premetal dielectric and patterning the metal to form the usual lines for the first level of a multilevel interconnect structure. The method of metal patterning can be accomplished in any of the systems well known to the art. After patterning the metal lines an intermetal dielectric is deposited over the patterned metal as well as the premetal dielectric. Then, by CMP, the dielectric is polished down to the top level of the metal. Metal for the via can then be deposited as a layer over the patterned metal pattern and the dielectric. The via metal is subsequently etched in a pattern designed to leave via stubs as required in contact with the underlying metal lines. Another layer of intermetal dielectric is applied over the via stubs, exposed portions of the underlying metal lines and dielectric. Again, the newly added intermetal dielectric is chemically mechanically polished down to the level of the via stubs. These same steps can be repeated to form additional levels of the integrated circuit.

BRIEF DESCRIPTION OF THE DRAWING

Additional objects and features of the invention will be more readily apparent from the following detailed description and appended claims when taken in conjunction with the drawing, in which:

FIG. 1 is a view showing a premetal dielectric having a first metal blanket layer deposited thereon;

FIG. 2 is a view similar to FIG. 1 but showing the deposited metal blanket layer having been patterned to form circuit lines;

FIG. 3 is a view similar to FIG. 1 but showing an intermetal dielectric deposited over the patterned metal lines and the underlying dielectric;

FIG. 4 is a view showing the structure of FIG. 3 after the intermetal dielectric has been chemical mechanically polished to the tops of the patterned metal lines;

FIG. 5 is a view similar to FIG. 4 but showing the addition of a blanket layer of metal, parts of which will be used to form vias;

FIG. 6 is a view similar to FIG. 5 but showing the via blanket metal patterned into individual vias in contact with the underlying metal lines;

FIG. 7 is a view similar to FIG. 6 but showing an additional layer of intermetal dielectric over the overall structure;

FIG. 8 is a view showing the structure of FIG. 7 after the second intermetal dielectric has been polished down to the level of the tops of the via stubs; and FIG. 9 is a view similar to FIG. 8 but showing a blanket layer of metal overlying the stubs and the intermetal dielectric to be patterned into circuit lines for a next level of a multi-level circuit which may be completed in accordance with the steps shown in FIGS. 2 through 8.

DESCRIPTION OF THE PREFERRED EMBODIMENTS

Figure 1:
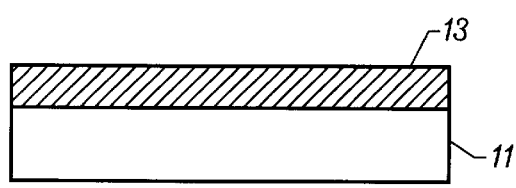
FIGS. 1 through 9 are schematic cross-sectional views each showing different stages in the process in accordance with the invention. Specifically.

In FIG. 1, there is shown a premetal dielectric 11 over which has been deposited a blanket layer of metal 13. The dielectric may be silicon dioxide or any other desired dielectric and the metal 13 may be any of the metals normally used as metal lines in integrated circuit devices. Preferably, the metal would be Aluminum/Copper. Al—Cu would also be the preferred metal for the via metal layers.

Figure 2:
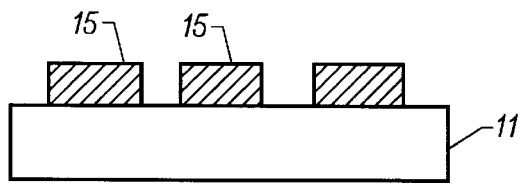
Figure 3:
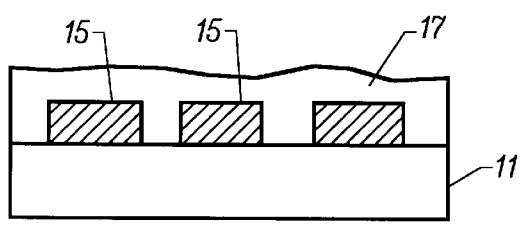
Figure 4:
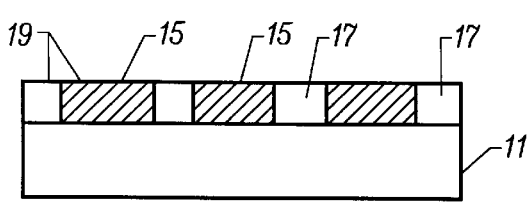
Figure 5:
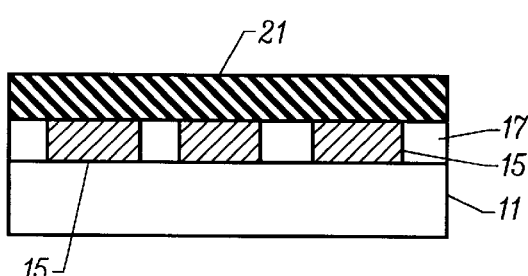

After masking and etching the metal 13, the structure appears as shown in FIG. 2 wherein a series of metal line elements 15 are formed on the premetal dielectric. The line elements 15 are for use interconnecting various circuits on this particular level of the integrated circuit. As shown in FIG. 3, an intermetal dielectric 17 is deposited over the line elements 15 and the underlying dielectric 11. Preferably, the dielectric will consist of a high density plasma gap-fill oxide. Dielectric 17 should be deposited just thickly enough to allow chemical mechanical polishing reproducibly down to the top level of the metal line elements 15. After the chemical mechanical polishing, a level surface 19 is realized as the top of the overall structure. Next, as shown in FIG. 5, a blanket layer 21 of a metal which will be used as the via stubs, is deposited over the structure as shown in FIG. 4. The blanket layer 21 may be of any convenient metal and is preferably aluminum/copper. Prior to depositing the blanket layer 21 any surface oxide may be removed such as by sputter etching. Moreover, a blanket deposition of a TiN glue layer may also be employed particularly when the etched metal is Tungsten. In addition, if required, a TiN or TiW top layer may be deposited on the metal blanket layer 21 to serve as an anti-reflective layer in subsequent masking processes.

Figure 6:
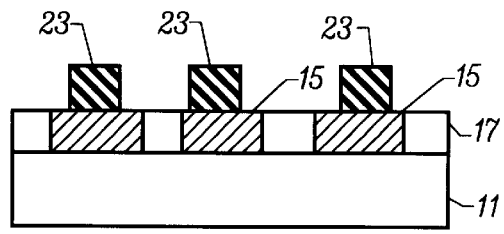
Figure 7:
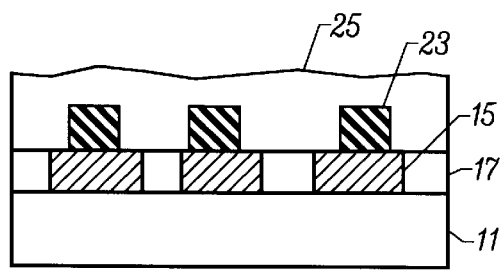
Figure 8:
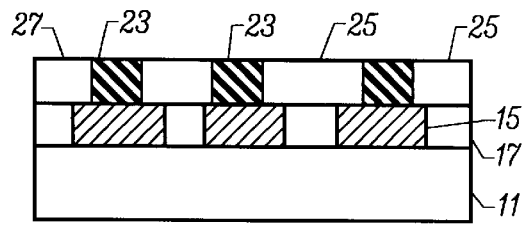

Subsequent masking and etching produces the structure as shown in FIG. 6 wherein a number of via stubs 23 are shown in contact with individual line elements 15. As shown in FIG. 7, a second layer of intermetal dielectric 25 is deposited over the via stubs 23, the exposed line elements 15 and dielectric 17. Again, the dielectric 25 may be a high density plasma gap-fill oxide. As shown in FIG. 8, the second layer of dielectric 25 was also chemically mechanically polished so as to produce a level upper surface 27.

Figure 9:
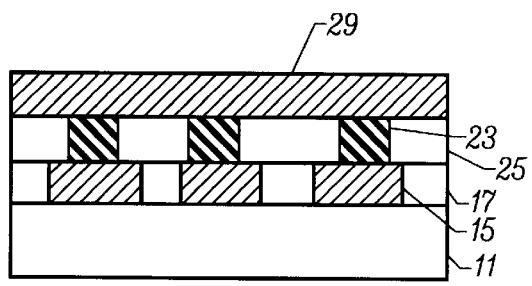

The next blanket layer of metal can then be deposited as shown in FIG. 9. This level 29 may be patterned as the first level 13 had been patterned and, with the various steps as shown in FIGS. 2 through 8, a second overall level of the integrated circuit can be formed. Still additional levels can, of course, be added on top of the second level, each being performed with the same process as previously described.

In summary, the proposed process is aimed at eliminating several critical problems encountered with current backend structures through process simplification which enable greater control at each stage of the integration sequence. These advantages include the elimination of the step coverage problem such as overhang and poor bottom and sidewall coverage of via trenches which have been a major issue with the conventional prior art processes. The proposed method eliminates the need to deposit a barrier layer in a via or a contact. Furthermore, with the present invention better control of the total intermetal dielectric thickness is accomplished by reason of the dual chemical mechanical polishing sequence. That is, a polishing after the line element metal and the via metal depositions. This procedure ensures greater via height uniformity across the wafer since dishing is practically eliminated on via-occupied areas and good metal-oxide selectivity is maintained. The process is simplified in that the optimization can be of the chemical mechanical polishing alone and that process can be expedited by using identical top layers for both metal and via stacks thus obviating the need to evaluate multiple oxide/metal selectivities. For instance, the top layers in both instances could be TiN or TiW.

Moreover, the system as described can be utilized with the damascene process with the deposition and patterning of the via metal layer after patterning the underlying metal layer with the damascene process. Consequently, this method can be used in cases where dual damascene process is not feasible.

Furthermore, via resistance produced by the process in accordance with the invention are lower since the via metal is deposited as a blanket directly on patterned metal lines thus reducing the likelihood of forming high resistance interfaces. By contrast, the standard oxide etch processes use stripping solvents for forming polymeric by-products generated during etch and such stripping can cause gouging of aluminum/copper thus increasing the via resistance. Moreover, the via resistance can be lowered in the instant process while increasing electro migration resistance by employing aluminum as the via metal. If aluminum is used instead of Ti/TiN/TiW, the main requirement for proper patterning is good etch selectivity between the aluminum and the top layer of the underlying metal. For instance, TiW can be used instead of TiN.

We claim:

1. A method of forming interconnect vias in a semiconductor device comprising, in sequence, the steps of:

depositing a first layer of metal on a substrate, said first layer of metal including an anti-reflective layer on its top surface;

forming a first metal pattern in said first metal layer;

depositing a first layer of dielectric over said first metal pattern and said substrate to a level above said first metal pattern to a sufficient thickness to allow subsequent polishing down to the top level of said first metal pattern;

polishing said first layer of dielectric down to the top level of said first metal pattern;

depositing a second layer of metal directly onto the polished surface of said first metal pattern and said dielectric, said second layer of metal including an anti-reflective layer on its top surface;

etching said second layer of metal in a second pattern leaving metal stubs in locations where interconnects are desired;

depositing a second layer of dielectric over said stubs and the exposed portions of said first metal pattern and said first layer of dielectric;

polishing said second layer of dielectric at least down to the top level of said stubs; and depositing a third layer of metal over the polished surface of said second pattern and said dielectric.

2. A method of forming interconnect vias in a semiconductor device as defined in claim 1 wherein said first layer of dielectric is a high density plasma oxide.

3. A method of forming interconnect vias in a semiconductor device as defined in claim 1 wherein said step of polishing said first layer of dielectric comprises chemical mechanical polishing.

4. A method of forming interconnect vias in a semiconductor device as defined in claim 1 together with the additional step of sputter etching said polished first layer of dielectric.

5. A method of forming interconnect vias in a semiconductor device as defined in claim 1 wherein said second layer is aluminum.

6. A method of forming interconnect vias in a semiconductor device as defined in claim 1 wherein said anti-reflective layer is TiN.

7. A method of forming interconnect vias in a semiconductor device as defined in claim 1 wherein said anti-reflective layer is TiW.

8. A method of forming interconnect vias in a semiconductor device as defined in claim 1 wherein said second layer of dielectric is a high density plasma oxide.

9. A method of forming interconnect vias in a semiconductor device as defined in claim 1 wherein said step of polishing said second layer of dielectric comprises chemical mechanical polishing.

10. A method of forming interconnect vias in a semiconductor device as defined in claim 1 wherein said first layer of metal and said second layer of metal are formed of the same metal.

11. A method of forming interconnect vias in a semiconductor device as defined in claim 10 wherein said same metal is aluminum.

* * * * *